United States Patent
Phlegm et al.

(10) Patent No.: US 9,587,118 B2
(45) Date of Patent: Mar. 7, 2017

(54) THERMAL PROTECTION SYSTEM FOR POWERED CIRCUIT BOARDS INCLUDING FUSES

(71) Applicant: GM Global Technology Operations LLC, Detroit, MI (US)

(72) Inventors: Herman K. Phlegm, West Bloomfield, MI (US); Mahmoud H. Abd Elhamid, Troy, MI (US); Edgar P. Calderon, Sterling Heights, MI (US); Sami A. Syed, Windsor (CA)

(73) Assignee: GM Global Technology Operations LLC, Detroit, MI (US)

( * ) Notice: Subject to any disclaimer, the term of this patent is extended or adjusted under 35 U.S.C. 154(b) by 0 days.

(21) Appl. No.: 14/710,216

(22) Filed: May 12, 2015

(65) Prior Publication Data

US 2016/0333194 A1    Nov. 17, 2016

(51) Int. Cl.
*C09D 5/18* (2006.01)
*H05K 3/28* (2006.01)

(52) U.S. Cl.
CPC ............. *C09D 5/185* (2013.01); *H05K 3/284* (2013.01); *H05K 2201/10181* (2013.01)

(58) Field of Classification Search
CPC .................. C09D 5/185; H05K 3/284; H05K 2201/10181
See application file for complete search history.

(56) References Cited

U.S. PATENT DOCUMENTS

| 5,401,793 A * | 3/1995 | Kobayashi | C09D 5/185 428/416 |
| 2006/0079612 A1 * | 4/2006 | Troutman | C09D 5/185 524/99 |

OTHER PUBLICATIONS

Dong et al., "Influence of Nano-Boron Nitride on Fire Protection of Waterborne Fire-Resistive Coatings," J. Coat. Technol. Res., 11 (2) 265-273, 2014.*

* cited by examiner

*Primary Examiner* — Hai Vo
(74) *Attorney, Agent, or Firm* — Brooks Kushman P.C.

(57) ABSTRACT

A coated electronic device that is fire resistant includes an electronic component and an intumescent layer disposed over the electronic component. The intumescent layer includes sodium silicate having formula $Na_2SiO_3$, pentaerythitol, a resin that is cross-linked by melamine, boron nitride particles, and triammonium phosphate.

16 Claims, 1 Drawing Sheet

THERMAL PROTECTION SYSTEM FOR POWERED CIRCUIT BOARDS INCLUDING FUSES

TECHNICAL FIELD

In at least one aspect, the present invention relates to intumescent coatings for electronic components, and in particular, to intumescent coatings for circuit boards and fuses that may be subject to overheating and a fire hazard.

BACKGROUND

Many electronic devices are subject to overheating thereby providing some risk of fire. For example, a large amount of heat can be generated by a short circuit in a device. Such a short circuit may occur by inadvertent contact of an electronic component with water from a coolant leak or moisture accumulation. Moreover, a failing component might cause a high electric potential which also creates a first of fire or thermal runaway.

Prior art methods attempt to address the risks of fire hazards in electronic devices in a variety of ways. For example, an electronic device might be encased in a fire resistant enclosure. Although such methods work reasonably well, few prior art methods which address fire resistance provide multidimensional solutions to this problem.

Accordingly, there is a need for methods and components for reducing the risk of fire in an electronic component while providing fire suppression if a fire should occur.

SUMMARY

The present invention solves one or more problems of the prior art by providing, in at least one embodiment, a coated electronic device that is fire resistant. The coated electronic device includes an electronic component and an intumescent layer disposed over the electronic component. The intumescent layer includes sodium silicate having formula $Na_2SiO_3$, pentaerythitol, a resin that is cross-linked by melamine, boron nitride particles, and triammonium phosphate.

In another embodiment, a coated circuit board that is fire resistant is provided. The coated circuit board includes a circuit board substrate and an electronic component with an intumescent layer disposed over the electronic component. The intumescent layer includes sodium silicate having formula $Na_2SiO_3$, pentaerythitol, a resin that is cross-linked by melamine, boron nitride particles, and triammonium phosphate.

In another embodiment, a coated circuit board with fire resistance is provided. The coated circuit board includes a circuit board substrate and an intumescent layer disposed over the circuit board substrate. The intumescent layer includes sodium silicate in an amount from about 25 to 50 weight percent of the total weight of the intumescent layer, pentaerythitol in an amount from about 2 to 20 weight percent of the total weight of the intumescent layer, a condensation polymer that is cross-linked by melamine in an amount from about 20 to 60 weight percent of the total weight of the intumescent layer, boron nitride particles in an amount from about 2 to 30 percent of the total weight of the intumescent layer, and triammonium phosphate in an amount 0.1 to 3 percent of the total weight of the intumescent layer.

DETAILED DESCRIPTION

Figure 1:
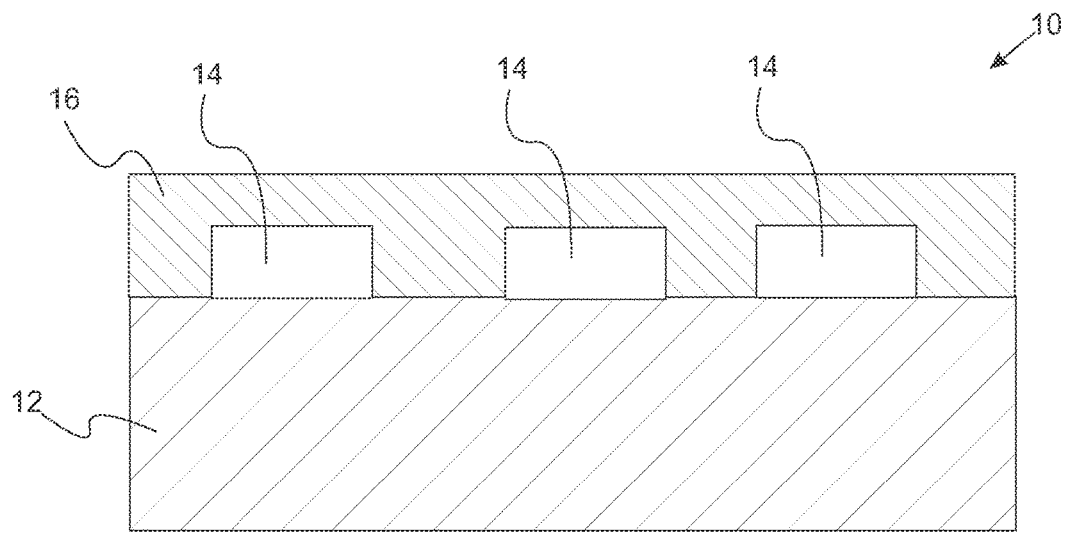
FIG. 1 is a cross section of a coated circuit board having an intumescent coating is provided.

Reference will now be made in detail to presently preferred compositions, embodiments and methods of the present invention which constitute the best modes of practicing the invention presently known to the inventors. The Figures are not necessarily to scale. However, it is to be understood that the disclosed embodiments are merely exemplary of the invention that may be embodied in various and alternative forms. Therefore, specific details disclosed herein are not to be interpreted as limiting, but merely as a representative basis for any aspect of the invention and/or as a representative basis for teaching one skilled in the art to variously employ the present invention.

Except in the examples, or where otherwise expressly indicated, all numerical quantities in this description indicating amounts of material or conditions of reaction and/or use are to be understood as modified by the word "about" in describing the broadest scope of the invention. Practice within the numerical limits stated is generally preferred. Also, unless expressly stated to the contrary: percent, "parts of," and ratio values are by weight; the description of a group or class of materials as suitable or preferred for a given purpose in connection with the invention implies that mixtures of any two or more of the members of the group or class are equally suitable or preferred; description of constituents in chemical terms refers to the constituents at the time of addition to any combination specified in the description and does not necessarily preclude chemical interactions among the constituents of a mixture once mixed; the first definition of an acronym or other abbreviation applies to all subsequent uses herein of the same abbreviation and applies mutatis mutandis to normal grammatical variations of the initially defined abbreviation; and, unless expressly stated to the contrary, measurement of a property is determined by the same technique as previously or later referenced for the same property.

It is also to be understood that this invention is not limited to the specific embodiments and methods described below, as specific components and/or conditions may, of course, vary. Furthermore, the terminology used herein is used only for the purpose of describing particular embodiments of the present invention and is not intended to be limiting in any way.

It must also be noted that, as used in the specification and the appended claims, the singular form "a," "an," and "the" comprise plural referents unless the context clearly indicates otherwise. For example, reference to a component in the singular is intended to comprise a plurality of components.

Throughout this application, where publications are referenced, the disclosures of these publications in their entireties are hereby incorporated by reference into this application to more fully describe the state of the art to which this invention pertains.

In general, embodiments of the present invention provide a coated electronic device that is fire resistant. The coated electronic device includes an electronic component substrate and an intumescent layer disposed over the electronic component substrate. In the present context, an electronic component substrate means an electronic device or component that is not coated or proximate to the intumescent layers. Examples of electronic component substrates include circuit boards, fuses, resistors, capacitors, integrated circuits, and the like. Characteristically, the intumescent layer includes sodium silicate having formula $Na_2SiO_3$, pentaerythitol, a resin that is cross-linked by melamine (e.g, melamine residues), boron nitride particles, and triammonium phosphate.

With reference to FIG. 1, a cross section of a coated circuit board having an intumescent coating is provided. Coated circuit board 10 includes circuit board substrate 12 having at least one electronic component 14. Intumescent layer 16 is disposed over, and typically contacts, portions of circuit board 10. In a refinement, intumescent layer 16 encapsulates circuit board substrate 12. In other refinements, intumescent layer 16 is in the form of a gel or foam. Characteristically, the intumescent layer 16 includes sodium silicate having formula $Na_2SiO_3$, pentaerythitol, a resin that is cross-linked by melamine, boron nitride particles, and triammonium phosphate.

Figure 2:
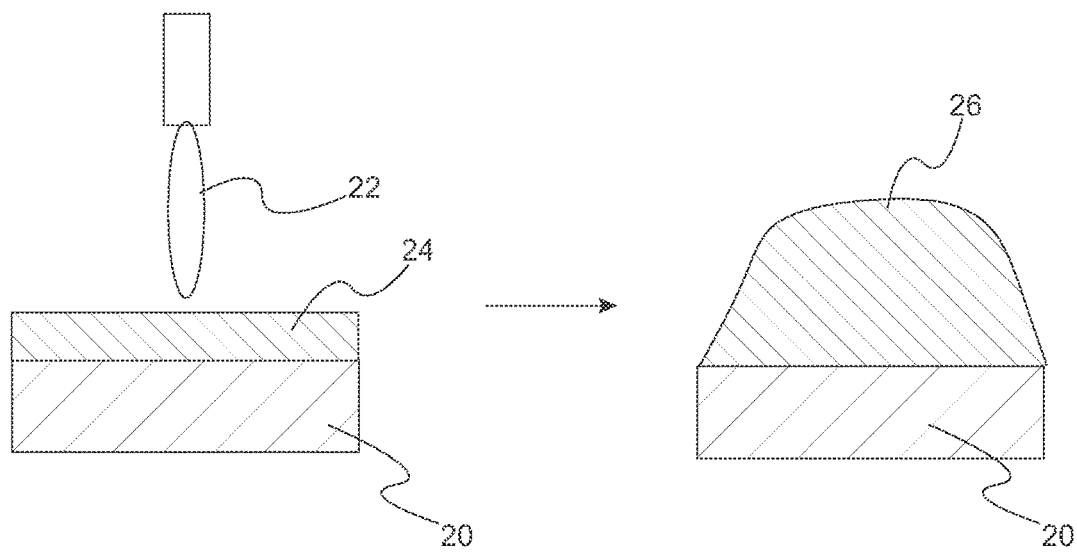
FIG. 2 is a schematic depiction of the expansion of an embodiment of an intumescent layer upon exposure of an electronic component substrate to a flame.

Advantageously, intumescent layer 16 provides three basic functions. The first function compliments the conformable coating aspect of intumescent layer 16. For example, upon the generation of heat due to a short circuit (e.g., caused by a coolant leak or moisture accumulation) or the presence of a high electric potential (tested to 394V), the $Na_2SiO_3$ decomposes and swells to prevent further ingress of $O_2$ to the substrate (i.e., the swelling of intumescent layer acts as a chemical sealant). FIG. 2 schematically depicts this expansion upon exposure of electronic component substrate 20 to a flame 22. Intumescent layer 24 is observed to expand and form an insulating char layer 26 of $Na_2SiO_3$ that can be up to 50 times the thickness of the electronic component substrate 20. Advantageously, this keeps the electronic component below its critical temperature while maintaining the structural integrity of the underlying material.

The secondary function of the intumescent layer is flame retardancy. In this regard, the ammonium phosphate decomposes upon heating to give phosphoric acid:

The generated phosphoric acid catalyzes the degradation of the pentaerythitol to form carbonaceous foam and water as depicted by the following reaction:

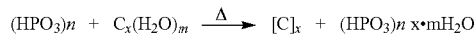

Melamine decomposes to form water and $N_2$ in the presence of heat which are useful in suppressing fire formation:

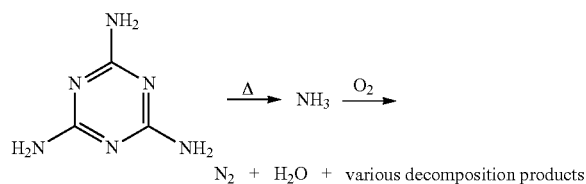

The various decomposition products include the following molecular moieties: $—CH_2—O—CH_2—$, $—NH_2$, $NH—CH_2—$, $NR_3$, and $—CH_2—OH$ where $R_3$ is methyl or ethyl.

The final function is to assist in heat dissipation from the electronic device. This is accomplished by the boron nitride, and in particular, nBN (nanostructured boron nitride) in the intumescent layer. For example, hexagonal boron nitride is reported to have thermal transfer values up to 1700 W/m-K. Moreover, hexagonal boron nitride is thermally but not electrically conductive. In addition to protection against oxidation (i.e. thermal runaway), embodiments of the intumescent layer can rapidly displace any heat accumulated on an electronic device (e.g., a fuse) to the surrounding environment.

In a variation of the present embodiment, the sodium silicate is present in an amount of sodium silicate of 25 to 50 weight percent of the total weight of the intumescent layer. In a variation, the sodium silicate is present in an amount of sodium silicate of 30 to 35 weight percent of the intumescent layer.

In still another variation, the pentaerythitol is present in an amount from about 2 to 20 weight percent of the total weight of the intumescent layer. In a refinement, the pentaerythitol is present in an amount from about 5 to 10 weight percent, In still another variation, the resin cross-linked by melamine is present in an amount from about 20 to 60 weight percent of the total weight of the intumescent layer. In a refinement, the resin cross-linked by melamine is present in an amount from about 30 to 40 weight percent, the boron nitride is present in an amount from about 5 to 20 weight percent, Typically, the boron nitride of intumescent layer 16 is a nanostructured boron nitride having an average spatial dimension from about 20 to 100 nanometers. In another variation, the boron nitride is present in an amount from about 2 to 30 percent. In a refinement, the boron nitride is present in an amount from about 5 to 20 weight percent.

In yet another variation, the triammonium phosphate is present in an amount from about 0.1 to 3 percent of the total weight of the intumescent layer. triammonium phosphate is present in an amount from about 0.5 to 1 weight percent.

In some variations, the intumescent coating further includes a filler typically in an amount from about 0.05 to 10 weight percent of the total weight of the intumescent layer. In a refinement, the filler can be an organic fillers or an inorganic filler. Examples of suitable organic fillers include but are not limited to, cellulose, organic pigments, organic UV-stabilizers, natural fibers, and polymeric fibers (e.g., polyester-based fibers and polyamide-based materials). Examples of suitable inorganic fibers includes, but are not limited to, talc, graphite, calcium carbonate, glass fibers, clays, feldspar, silica or glass, fumed silica, alumina, magnesium oxide, zinc oxide, titanium dioxide, glass microspheres, inorganic pigments, and combinations thereof.

In another embodiment, an intumescent layer-forming composition for applying the intumescent layer set forth above is provided. The composition includes a solvent, pentaerythitol, a resin that is cross-linked by melamine, boron nitride particles, and triammonium phosphate. Examples of suitable solvents include water, alcohols (e.g., ethanol, methanol, propanol, etc.), and combinations thereof. In one variation, the composition is an emulsion. In a refinement, the composition includes sodium silicate in an amount from about 2.5 to 25 weight percent of the total weight of the composition, the pentaerythitol in an amount from about 0.2 to 10 weight percent of the total weight of the composition, the resin cross-linked by melamine in an amount from about 2.0 to 30 weight percent of the total weight of the composition, the boron nitride in an amount from about 0.2 to 15 percent of the composition, triammonium phosphate in an amount 0.01 to 1.5 percent of the total weight of the intumescent layer, and the balance is solvent (e.g., typically from 10 to 50 weight percent). In general, the intumescent layer-forming composition is applied to an electronic component substrate and then the solvent is allowed to evaporate (e.g., drying or curing).

Tables 1 and 2 provide representative compositions of the intumescent coating that are suitable for protecting electronic devices.

TABLE 1

Intumescent coating composition

| Ingredient | Weight Percent |
|---|---|
| $Na_2SiO_3$ | 30 to 35 |
| pentaerythitol | 5 to 10 |
| melamine | 30 to 40 |
| nBN | 5 to 10 |
| $(NH_4)_3PO_4$ | 0.5 to 1 |
| filler | about 4 |

TABLE 2

Intumescent coating composition

| Ingredient | Weight Percent |
|---|---|
| $Na_2SiO_3$ | 30 to 35 |
| pentaerythitol | 5 to 10 |
| melamine/acrylic polymer base | 30 to 40 |
| nBN | 5 to 10 |
| $(NH_4)_3PO_4$ | 0.5 to 1 |
| filler | about 4 |

While exemplary embodiments are described above, it is not intended that these embodiments describe all possible forms of the invention. Rather, the words used in the specification are words of description rather than limitation, and it is understood that various changes may be made without departing from the spirit and scope of the invention. Additionally, the features of various implementing embodiments may be combined to form further embodiments of the invention.

What is claimed is:

1. A coated electronic device comprising:
   an electronic component substrate; and
   an intumescent layer disposed over the electronic component substrate, the intumescent layer including:
   sodium silicate having formula $Na_2SiO_3$;
   pentaerythitol;
   a resin that is cross-linked by melamine;
   boron nitride particles; and
   triammonium phosphate, wherein the sodium silicate is present in an amount from about 25 to 50 weight percent of the total weight of the intumescent layer, the pentaerythitol is present in an amount from about 2 to 20 weight percent of the total weight of the intumescent layer, the resin that is cross-linked by melamine is present in an amount from about 20 to 60 weight percent of the total weight of the intumescent layer, the boron nitride particles are present in an amount from about 2 to 30 percent of the intumescent layer, and triammonium phosphate is present in an amount 0.1 to 3 percent of the total weight of the intumescent layer.

2. The coated electronic device of claim 1 wherein the boron nitride particles are a nanostructured boron nitride having an average spatial dimension from about 20 to 100 nanometers.

3. The coated electronic device of claim 1 wherein the intumescent layer is a gel or foam.

4. The coated electronic device of claim 1 wherein the intumescent layer further includes a filler.

5. The coated electronic device of claim 1 wherein the electronic component substrate is encapsulated by the intumescent layer.

6. The coated electronic device of claim 1 wherein the resin that is cross-linked by melamine includes a condensation polymer.

7. The coated electronic device of claim 6 wherein the resin that is cross-linked by melamine includes a polyester resin or an alkyd resin, or an epoxy resin.

8. The coated electronic device of claim 1 wherein the electronic component substrate is a circuit board.

9. The coated electronic device of claim 1 wherein the electronic component substrate is a fuse.

10. A coated circuit board comprising:
    a circuit board substrate; and
    an intumescent layer disposed over the circuit board substrate, the intumescent layer including:
    sodium silicate in an amount from about 25 to 50 weight percent of the total weight of the intumescent layer;
    pentaerythitol in an amount from about 2 to 20 weight percent of the total weight of the intumescent layer;
    a condensation polymer that is cross-linked by melamine in an amount from about 20 to 60 weight percent of the total weight of the intumescent layer;
    boron nitride particles in an amount from about 2 to 30 percent of the total weight of the intumescent layer; and
    triammonium phosphate in an amount from about 0.1 to 3 percent of the total weight of the intumescent layer.

11. The coated circuit board of claim 10 wherein the boron nitride particles are a nanostructured boron nitride having an average spatial dimension from about 20 to 100 nanometers.

12. The coated circuit board of claim 10 wherein the sodium silicate is present in an amount from about 30 to 35 weight percent of the total weight of the intumescent layer, the pentaerythitol is present in an amount from about 5 to 10 weight percent of the total weight of the intumescent layer, the condensation polymer that is cross-linked by melamine is present in an amount from about 30 to 40 weight percent of the total weight of the intumescent layer, the boron nitride particles are present in an amount from about 5 to 20 weight percent of the total weight of the intumescent layer, and triammonium phosphate is present in an amount 0.5 to 1 weight percent of the total weight of the intumescent layer.

13. The coated circuit board of claim 10 wherein the intumescent layer further includes a filler.

14. The coated circuit board of claim 10 wherein the circuit board substrate is encapsulated by the intumescent layer.

15. The coated circuit board of claim 10 wherein the condensation polymer that is cross-linked by melamine is a polyester resin.

16. The coated circuit board of claim 10, wherein the condensation polymer that is cross-linked by melamine is an alkyd resin.

* * * * *